US008281216B2

(12) United States Patent
Desai et al.

(10) Patent No.: US 8,281,216 B2
(45) Date of Patent: Oct. 2, 2012

(54) METHOD FOR ASSIGNING AND UTILIZING FORWARD ERROR CORRECTING (FEC) CODES

(75) Inventors: Sanjay G. Desai, Lake in the Hills, IL (US); Kevin G. Doberstein, Elmhurst, IL (US); Harish Natarahjan, Streamwood, IL (US)

(73) Assignee: Motorola Solutions, Inc., Schaumburg, IL (US)

( * ) Notice: Subject to any disclaimer, the term of this patent is extended or adjusted under 35 U.S.C. 154(b) by 826 days.

(21) Appl. No.: 12/415,596

(22) Filed: Mar. 31, 2009

(65) Prior Publication Data

US 2010/0251070 A1   Sep. 30, 2010

(51) Int. Cl.
*G06F 11/00* (2006.01)
(52) U.S. Cl. .................. 714/762; 714/758; 714/761
(58) Field of Classification Search .......... 714/761, 714/762, 758, 752, 787, 788, 786
See application file for complete search history.

(56) References Cited

U.S. PATENT DOCUMENTS

| 6,141,388 | A | * | 10/2000 | Servais et al. ................. 375/262 |
| 6,498,936 | B1 | * | 12/2002 | Raith ............................. 455/466 |
| 6,658,262 | B1 | * | 12/2003 | Lundborg ....................... 455/522 |
| 2003/0231658 | A1 | | 12/2003 | Liang et al. |
| 2005/0019036 | A1 | | 1/2005 | Soto et al. |
| 2007/0076708 | A1 | | 4/2007 | Kolakowski et al. |
| 2007/0101228 | A1 | * | 5/2007 | Vesma et al. ................... 714/752 |
| 2008/0052603 | A1 | * | 2/2008 | Wiatrowski et al. .......... 714/776 |
| 2008/0168329 | A1 | * | 7/2008 | Han et al. ....................... 714/764 |
| 2009/0100310 | A1 | * | 4/2009 | Yoo et al. ....................... 714/748 |
| 2009/0254796 | A1 | * | 10/2009 | Hassner et al. ............... 714/780 |

FOREIGN PATENT DOCUMENTS

EP    1986363 A1    10/2008

OTHER PUBLICATIONS

PCT International Search Report Dated Oct. 21, 2010.

* cited by examiner

*Primary Examiner* — Scott Baderman
*Assistant Examiner* — Sarai Butler
(74) *Attorney, Agent, or Firm* — Randi L. Karpinia; Anthony P. Curtis; Daniel R. Bestor

(57) ABSTRACT

An assignment scheme exploits the Media Access Control (MAC) layer protocol features under various MAC layer call scenarios. In one embodiment, the Hamming distance between pairs of critical Data Units are assigned to codewords with a minimum distance of dmin2=8 bits, thereby increasing the hard decision error correcting capability from 1 bit to 3 bits when deciding between these pairs of Data Units. The method for assigning data unit identification (DUID) codes by a radio operating within a wireless communication system includes determining by the radio whether an expected burst is a 4 Voice Burst with Encryption Synchronization Signaling (4V); when the expected burst is 4V, decoding the DUID within the received burst using an increased minimum distance; and when the expected burst is not 4V, decoding the DUID within the received burst using a minimum distance.

26 Claims, 4 Drawing Sheets

METHOD FOR ASSIGNING AND UTILIZING FORWARD ERROR CORRECTING (FEC) CODES

FIELD OF THE DISCLOSURE

The present disclosure relates generally to wireless communications and more particularly to a Forward Error Correction (FEC) coding method for use in a wireless communication system.

BACKGROUND

As public safety agencies evaluate their two-way radio needs for the future, many are reaching some similar conclusions: radio spectrum is becoming more congested and regulators are requiring public safety to do more with less, the demand for data transmission is more pronounced and often unachievable in narrow-band systems, systems need increased functionality, secure communication is a growing necessity, and improved digital voice quality is essential over more of the coverage area.

It will be appreciated that upgrading a communications network is a major undertaking in terms of time, energy and expense. A number of possible solutions are available, including the digital technologies that are now available.

The Association of Public-Safety Communications Officials (APCO) Project 25 is an industry-wide effort to set the recommended voluntary standards of uniform digital two-way radio technology for public safety organizations. Key objectives include providing enhanced functionality with equipment and capabilities focused on public safety needs, improving spectrum efficiency, ensuring competition among multiple vendors through Open Systems Architecture, and allowing effective, efficient, and reliable intra-agency and inter-agency communications.

BRIEF DESCRIPTION OF THE FIGURES

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
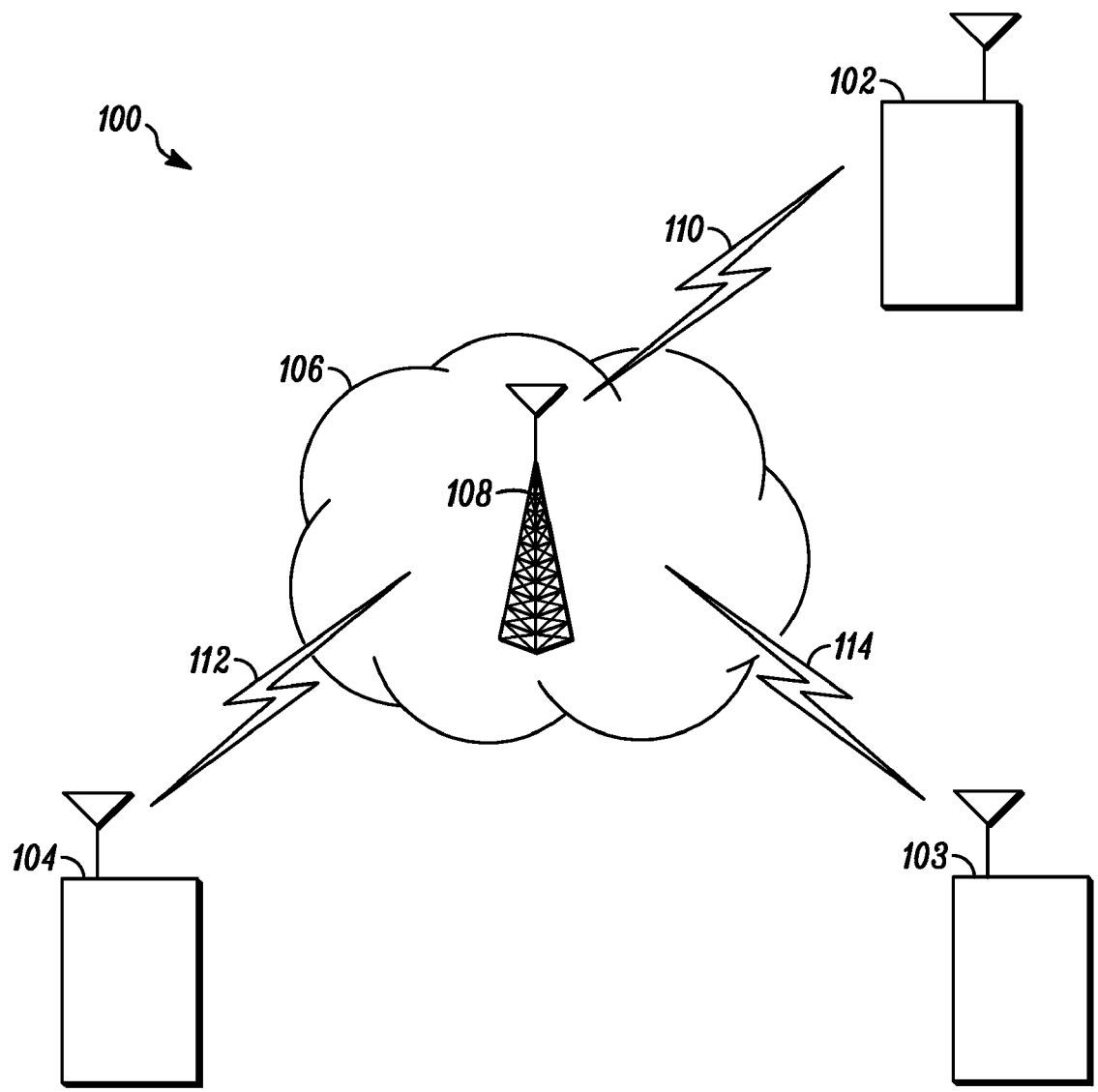
FIG. 1 illustrates a communication system in which various embodiments can be implemented.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION

According to some embodiments, the present invention includes a method for assigning codewords for a Forward Error Correcting (FEC) code by utilizing information from Media Access level procedures to maximize minimum distances between critical codewords. In one embodiment, this corresponds to assigning data unit identification (DUID) codes by a radio operating within a wireless communication system, the method comprising: determining by the radio whether an expected burst is a 4 Voice Burst with Encryption Synchronization Signaling (4V); when the expected burst is 4V, decoding the DUID within the received burst using an increased minimum distance; and when the expected burst is not 4V, decoding the DUID within the received burst using a minimum distance.

FIG. 1 illustrates a wireless communication system 100 in which various embodiments of the present invention can be implemented. The wireless communication system 100 comprises a plurality of communications devices such as the illustrated communication devices 102, 103, and 104, which may be, for example, a portable or mobile radio, a personal digital assistant, a cellular telephone, a video terminal, a portable computer with a wireless modem, or any other wireless device. For purposes of the following discussions, the communication devices will be referred to as "radios", but they are also referred to in the art as mobile stations, mobile equipment, handsets, subscribers, etc.

As illustrated, for example, the radios 102, 103, and 104 communicate over a radio access network 106. Those of ordinary skill in the art will realize that any type of network is within the scope of the teachings herein. Thus, the radio access network 106 may comprise infrastructure such as, but not limited to, base stations (BS) (with a single BS 108 shown for clarity), BS controllers (not shown), network elements (such as, a mobile switching center, home location register, visitor location register, a trunking resource controller, a console operator position, etc.), and the like, to facilitate the communications between radios having access to the radio access network 106. It will be appreciated by those of ordinary skill in the art that other radio access networks (not shown) can also be connected to radio access network 106 to enable communication over wider areas spanned by multiple radio access networks.

For example, radio 102, 103, and radio 104 can communicate with each other through BS 108. As is known by one of ordinary skill in the art, BS 108 generally comprises one or more repeater devices that can receive a signal from a transmitting radio over one wireless link and re-transmit to listening radios over different wireless links. For example, radio 102 can transmit over link 110 to BS 108 and BS 108 can re-transmit the signal to listening radios 103 and 104 over wireless links 114 and 112. BS 108 can also receive a signal from radio 103 over wireless link 114 and re-transmit the signal to radios 102 and 104 over wireless links 110 and 112. Alternately, BS 108 can receive a signal from radio 104 over wireless link 112 and re-transmit the signal to radios 102 and 103 over wireless links 110 and 114. For ease of illustration, only three radios and one BS are shown. However, those skilled in the art will realize that, in a typical system, a radio network can include any number of radios and any number of Base Stations. Moreover, although in this embodiment communication between radios 102, 103, and 104 are illustrated as being facilitated by BS 108, radios 102, 103, and 104 can communicate using a direct mode of operation without a BS. The teachings herein are equally applicable to direct mode operation between two radios.

Since network 106 is a wireless network, meaning that it supports a wireless or air interface protocol for signal transmission, the radios 102, 103, and 104, and BS 108, comprise transceivers that include a transmitter and a receiver for transmitting and receiving radio frequency (RF) signals, respectively. Radios 102, 103, and 104, and BS 108, further comprise one or more processing devices (such as microprocessors, digital signal processors, customized processors, field programmable gate arrays (FPGAs), unique stored program instructions (including both software and firmware), state machines, etc.) and typically some type of conventional memory element for performing (among other functionality) the air interface protocol and channel access scheme supported by network 106. Using these protocols, radios 102, 103, and 104 can each generate RF signals containing one or more data messages comprising a plurality of fields for organizing the continuous bits of information and/or signaling for transmission to another radio.

While one embodiment of a communication system 100 is described with regards to FIG. 1, those skilled in the art will recognize and appreciate that the specifics of this illustrative example are not specifics of the disclosure itself and that the teachings set forth herein are applicable in a variety of alternative settings. For example, since the teachings described do not depend on the type of air interface protocol or channel access scheme used (e.g., TDMA, Code Division Multiple Access (CDMA), Frequency Division Multiple Access (FDMA), and the like), the teachings can be applied to any type of air interface protocol and channel access scheme. The teachings herein can also be applied with any system and with any protocol utilizing wireline links. As such, other alternative implementations using different types of wireline or wireless protocols and channel access schemes are contemplated and are within the scope of the various teachings describe.

The APCO Project 25 Phase 2 Media Access Control (MAC) layer protocol standard defines seven (7) different burst types. A burst is a unit of transmission of a continuous succession of modulated bits that lasts for approximately a timeslot. A burst corresponds to the physical contents of a timeslot. There are three types of inbound bursts and four types of outbound bursts. Each of these bursts contains an 8 bit field used to identify the data unit type contained within the burst. This bit field within the burst is called a Data Unit Identifier (DUID).

The DUID is a field that exists in every burst type, both inbound and outbound. The DUID is used for identification of the data type (e.g. fast associated control channel (FACCH), slow associated control channel (SACCH), voice, and data channel (DCH)) contained within the burst, which allows the receiver to know how to decode the content and to know where in a transmission sequence it may be entering.

The sixteen (16) DUIDs currently defined in the APCO 25 Phase 2 MAC layer standard require four (4) information bits to uniquely identify them. In order to protect these information bits from channel introduced errors they are encoded using an (8, 4) block code. Thus, the DUID codeword occupies eight (8) bits within a burst. These 8 bits are spread across the burst in four groups of 2 bits for both inbound and outbound bursts. The generator matrix for this (8, 4) code is as shown below:

TABLE 1

DUID Generator Matrix

| 1 | 0 | 0 | 0 | 1 | 1 | 0 | 1 |
| 0 | 1 | 0 | 0 | 1 | 0 | 1 | 1 |
| 0 | 0 | 1 | 0 | 1 | 1 | 1 | 0 |
| 0 | 0 | 0 | 1 | 0 | 1 | 1 | 1 |

The P25 Phase 2 MAC standard defines a fast associated control channel (FACCH) as a signaling channel using slots normally assigned to voice on the voice channel (VCH). The FACCH is normally used for call establishment, hang-time, and teardown signaling.

Further, the P25 Phase 2 MAC standard defines a slow associated control channel (SACCH) as a periodic bi-directional logical channel on the VCH, which is used to exchange signaling or data information between the Fixed Network Equipment (FNE) and one or several Subscriber Units (SUs) assigned to the corresponding voice logical channel. An outbound SACCH is used to convey general broadcast information signaling to receiving radios such as call specific signaling, including call grants, and information regarding current channel users and current call type information about other active calls enabling radio scanning operation, paging signaling for moving individual users out of a call, and signaling to transmitting radios such as power control signaling and transmitter shutdown signaling. An Inbound SACCH is used to convey call specific signaling, including information regarding current channel users and current call type, call interrupt requests from listening radios, and call continuation requests during hang time. One SACCH per logical voice channel occur every twelve slots, which is commonly known as a superframe.

The 8-bit output codeword bits corresponding to the 4-bit input information bits created by the generator matrix in Table-1 are shown below. (It will be appreciated by those of ordinary skill in the art that the symbol "%" utilized herein indicates that the digits following are in a binary representation.):

| Input Information | 8-Bit Output Codeword |
|---|---|
| %0000 | %0000 0000 |
| %0001 | %0001 0111 |
| %0010 | %0010 1110 |
| %0011 | %0011 1001 |
| %0100 | %0100 1011 |
| %0101 | %0101 1100 |
| %0110 | %0110 0101 |
| %0111 | %0111 0010 |
| %1000 | %1000 1101 |
| %1001 | %1001 1010 |
| %1010 | %1010 0011 |
| %1011 | %1011 0100 |
| %1100 | %1100 0110 |
| %1101 | %1101 0001 |
| %1110 | %1110 1000 |
| %1111 | %1111 1111 |

It can be seen from the above table that minimum Hamming distance of this code, is d_min.=4. The number of corresponding bits that differ between two codewords is the Hamming distance of those two codewords. For example, the Hamming distance between the codewords 1001 and 0101 is 2. The minimum Hamming distance of a code is the minimum of the Hamming distance between all possible pairs of codewords of that code.

Assignment of Data Unit types to codewords is commonly done by starting at the first input information value %0000 and continuing until all available codes are used. In the table below and hereinafter, 4V burst is indicative of "4 Voice Burst with Encryption Synchronization Signaling (ESS)". Similarly, 2V burst is indicative of "2 Voice Burst with ESS." An assignment scheme following this guideline is shown below:

| Data Unit | Input Information | 8-Bit Output Codeword |
|---|---|---|
| 4V Burst | %0000 | %0000 0000 |
| 2V Burst | %0001 | %0001 0111 |
| FACCH (/w scrambling) | %0010 | %0010 1110 |
| FACCH (/No scrambling) | %0011 | %0011 1001 |
| SACCH (/w scrambling) | %0100 | %0100 1011 |
| SACCH (/No scrambling) | %0101 | %0101 1100 |

It will be appreciated by one skilled in the art that hard decision decoding of the (8, 4) coding with the assignment scheme described and minimum distance dmin=4 above is capable of correcting only one (1) bit error out of 8-bit codewords. Soft decision decoding can be used to improve the performance, but this improvement is still not adequate alone. Choosing a larger code size is not possible because of limitations of the slot size and number of bits available for the DUID code. Therefore, there is a need to improve the reliability of using this DUID code through alternate techniques.

The present invention provides an assignment scheme that exploits the Media Access Control (MAC) layer protocol features under various MAC layer call scenarios. In one embodiment of the claimed and described scheme, the Hamming distance between pairs of critical Data Units are assigned to codewords with a minimum distance of dmin2=8 bits, thereby increasing the hard decision error correcting capability from 1 bit to 3 bits when deciding between these pairs of Data Units.

The assignment scheme in accordance with the present invention is as shown below, which uses the same generator matrix as described previously herein:

| Data Unit | Input Information | 8-Bit Output Codeword |
|---|---|---|
| 4V Burst | %0000 | %0000 0000 |
| 2V Burst | %0110 | %0110 0101 |
| FACCH (/w scrambling) | %1001 | %1001 1010 |
| FACCH (/No scrambling) | %1111 | %1111 1111 |
| SACCH (/w scrambling) | %0011 | %0011 1001 |
| SACCH (/No scrambling) | %1100 | %1100 0110 |

Based on the above assignments one of ordinary skill in the art would observe:
1) The output codewords for the FACCH/No scrambling and the 4V DUIDs are 8-bits apart in terms of Hamming distance between them.
2) The output codewords for the SACCH/w scrambling and SACCH/No scrambling DUIDs are 8-bits apart in terms of Hamming distance between them.

The location of a SACCH burst within a super frame is known to all receiving units. The SACCH burst carries SYNC on the inbound. The SACCH burst may be scrambled or un-scrambled. To distinguish between the scrambled and un-scrambled SACCH, the Hamming distance between them is chosen to be 8-bits which allows for a hard decision error correcting capability of 3-bits out of 8-bit codeword. It will be appreciated by those of ordinary skill in the art that the hard decision error correcting decoder could be replaced with soft decision decoder that picks which of the two possible codewords the received signal is closer to in order to further enhance the probability of decoding the burst correctly.

Further, another MAC scenario where the invention described herein can be applied is to the situation of voice call ending. The P25 Phase 2 MAC protocol allows a voice call to end on any voice burst within the super frame.

Figure 2:
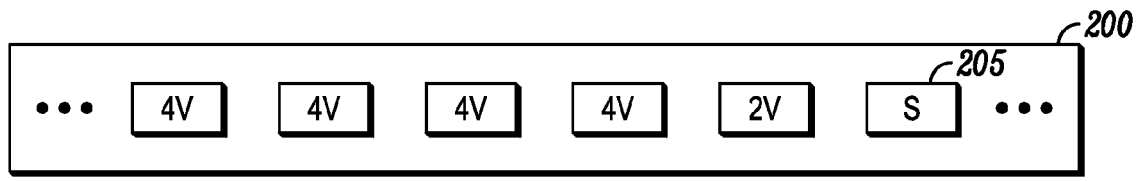
FIGS. 2 through 7 illustrate various examples of sequencing of data units in accordance with some embodiments.
Figure 3:
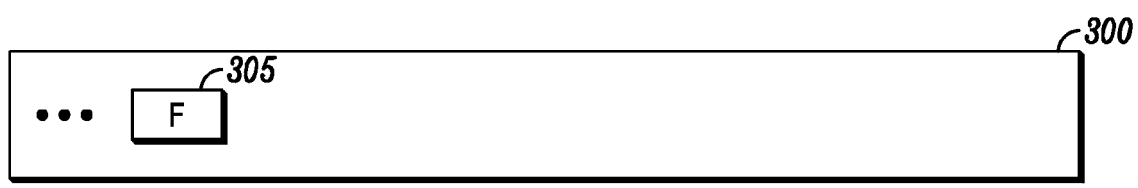
Figure 4:
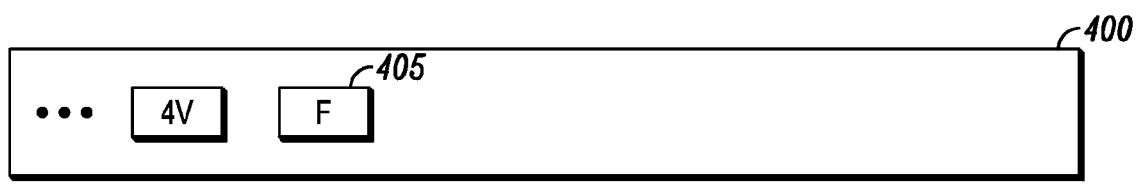
Figure 5:
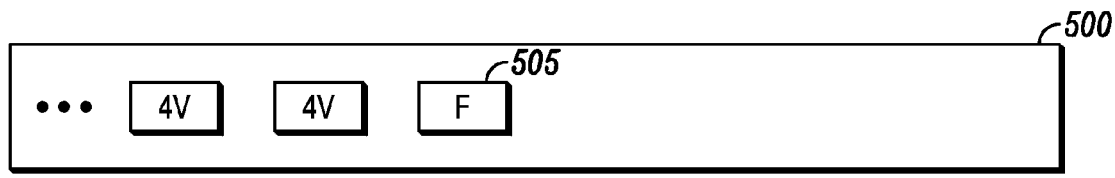
Figure 6:
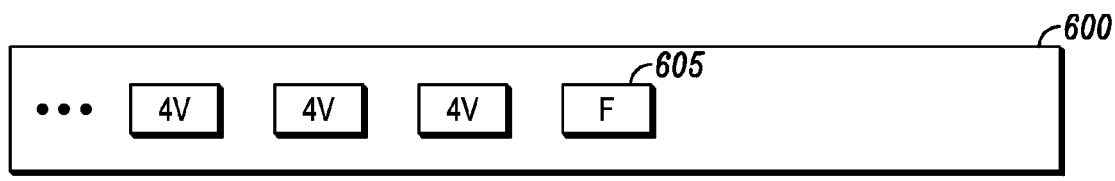
Figure 7:
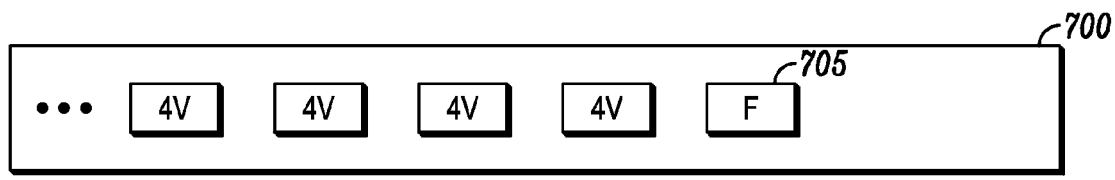

FIGS. 2 through 7 illustrate various examples of sequencing of data units in accordance with some embodiments. FIG. 2 illustrates one example of a typical sequencing of data units during a voice call. It will be appreciated by those of ordinary skill in the art that this is not the only sequencing that is valid with the P25 Phase 2 MAC protocol. For example, although the sequencing of the 4V and 2V bursts is always the same, the SACCH burst 205, can be placed between any of the other bursts in the voice sequence. The call terminating burst is always an un-scrambled FACCH with SYNC. FIGS. 3 through 7 illustrate examples of possible ways the terminating FACCH burst (305 in FIG. 3, 405 in FIG. 4, 505 in FIG. 5, 605 in FIG. 6, and 705 in FIG. 7) can occur within the sequence. In FIG. 3, data sequence 300, the terminating "F" burst 305 occurs during the first 4V of the voice sequence. In FIG. 4, data sequence 400, the terminating "F" burst 405 occurs during the second 4V of the voice frame. In FIG. 5, data sequence 500, the terminating burst 505 occurs with the third 4V of the voice frame. In FIG. 6, data sequence 600, the terminating burst 605 occurs with the fourth 4V of the voice frame. In FIG. 7, data sequence 700, the terminating burst 705 occurs with the 2V of the voice frame. In order to prevent a FACCH/No scrambling from being mistaken for a 4V burst or vice versa, the Hamming distance between them was chosen to be 8-bits which allows for a hard decision error correcting capability of 3 bits out of 8-bit codeword. Note that of the five (5) possible locations the terminating "F" burst can be located, four (4) of them are now at maximal distance, in this code 8-bits, from the other possible data unit type in that location. While it is also possible that a FACCH/No scrambling may be mistaken for a 2V burst or vice versa, it is much less likely than a FACCH/No scrambling being mistaken for 4V as there is only 1/5 chances that the terminator will show up on the 2V burst. Since it is not possible for the 4V burst and the 2V burst to be 8-bits away from FACCH/No scrambling burst, the present invention provides an algorithm which, for this Forward Error Correcting (FEC) code and MAC procedure, provides the best possible performance.

As mentioned above, a FACCH burst without scrambling is used to end/terminate a call. This FACCH may arrive anywhere within a super frame except for where a SACCH is defined to occur. Once the cyclic redundancy check (CRC) is verified to be correct and the DUID verified to be a FACCH burst without scrambling then it is assumed to be a call termination indication and appropriate action is taken. Otherwise, it is assumed to be a 4V burst or a 2V burst depending upon the offset value in the SACCH burst obtained from either the previous SACCH burst or other signaling present on the FAACH before the voice call starts.

Figure 8:
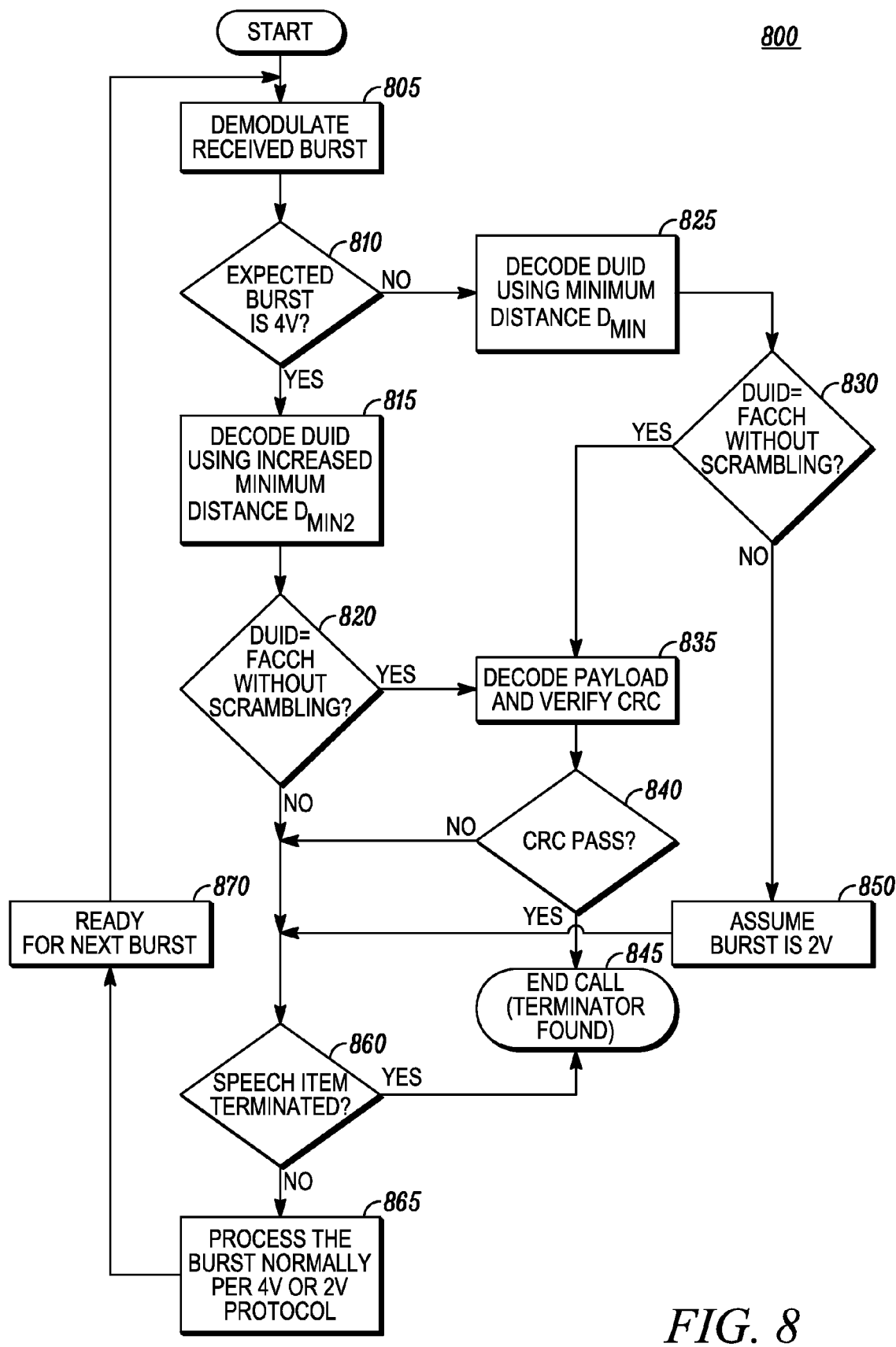
FIG. 8 is a flowchart of a method of processing a received burst in accordance with some embodiments.

FIG. 8 is a flowchart of a method 800 of processing a received burst in accordance with some embodiments. The method 800, for example, can be operated within any one of the radios 102, 103, and/or 104 and/or the base station 108 of the communication system 100 of FIG. 1. Specifically, FIG. 8 illustrates the operations previously described herein in accordance with some embodiments.

As illustrated, the method 800 begins with Step 805 in which a received burst is demodulated. Next in Step 810, it is determined whether the expected burst is 4V. When the expected burst is 4V, the operation continues to Step 815 in which the information obtained from the received burst is decoded to determine if the DUID is more likely a 4V or a FACCH without scrambling using the increased minimum distance dmin2=8. One method to accomplish this would be to compare the received DUID bits with the DUID bits corresponding to the FACCH without scrambling. When the number of bits in error is less than or equal to 3 then the FACCH without scrambling is chosen as the decoded DUID, else the 4V is chosen as the decoded DUID. It will be appreciated by those of ordinary skill in the art that step 815 could be replaced with a soft decision decoder that picks which of the two possible codewords the received signal is closer to in order to further enhance the probability of decoding the burst correctly. Next, in Step 820, it is determined whether or not the DUID is FACCH without Scrambling.

Returning to Step 810, when the expected burst is not 4V, the operation continues to Step 825 in which a decision is made in decoding of the DUID bits, this time allowing only one bit error as the 2V codeword and FACCH without scrambling codeword only have a minimum distance between them of dmin=4 bits apart after (8,4) encoding. It will be appreciated by those of ordinary skill in the art that the hard decision bit error comparison step could be replaced with soft decision decoding to enhance the probability of decoding the burst correctly as was discussed with respect to Step 815. Next, in Step 830, it is determined whether or not the DUID is FACCH without Scrambling. When the DUID is FACCH without scrambling in Step 830, the method continues to Step 835 in which the payload is decoded, and CRC is verified. Next, in Step 840, it is determined whether the CRC passed. When the CRC passes, the call is ended at Step 845 (i.e. the terminator is found). Returning to step 840, if the CRC does not pass, the method continues to step 860.

Returning to Step 830, when the DUID is not FACCH without scrambling, the operation continues to Step 850 in which it is assumed that the burst is 2V. Thereafter, the operation continues to Step 860.

Next, in Step 860, it is determined whether or not the speech item is terminated. For example, it can be determined that the speech item is terminated through the detection of a FACCH without scrambling. Alternatively, it can be determined that the speech item is terminated when the received DUIDs for these bursts do not match the expected DUIDs for a specified number of occurrences in a particular duration of time, wherein the number of occurrences and duration of time can be pre-programmed into the radio. When the speech item is terminated, the operation proceeds to Step 845 and the call is ended. When the speech item is not terminated, the method continues to Step 865 in which the burst is processed per 4V or 2V protocol as is described in the MAC protocol specifications. Next, in Step 870, the operation is ready for the next burst and cycle back to Step 805 upon receipt of the next burst.

When these features/facts about the MAC layer protocol are exploited, the newly defined DUID coding scheme becomes more robust. The limited set of larger Hamming distances that exist between some of the codewords is used to the best advantage through this invention by making use of MAC protocol procedures.

It will be appreciated by those of ordinary skill in the art that other codeword assignments may be made that also exploit the limited set of larger Hamming distances and the MAC protocol and yet are different from those listed in the preferred embodiment here. These variations, while not mentioned explicitly here, are also covered by the claims. Further, it will be appreciated by those of ordinary skill in the art that this technique is not limited to the FEC code with generator matrix and the particular MAC protocol described in this document. Other FEC codes that have minimum distance properties similar to those of the described code, specifically codes that have different minimum distances between codewords, can also utilize this invention when coupled with the MAC protocol the code is used with.

In one embodiment, this method optimizes call termination (End of call on any burst), over existing method by increasing the Hamming distance between the 4V burst and the FACCH (without scrambling) burst to 8-bits.

The coding scheme as presented herein, when used with the features of the APCO Project 25 Phase 2 MAC layer protocol, provides a more robust overall system and protocol.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

We claim:

1. A method for selectively assigning codewords for a Forward Error Correcting (FEC) code by a radio operating within a wireless communication system to improve the detection and decoding of a subset pair of critical burst types out of a plurality of possible burst types at a receiving device, the method comprising:
   utilizing information from one or more Media Access level procedures to assign the subset pair of critical burst types to codewords with an increased minimum distance between them compared to minimum distances between other codewords for other burst types in the plurality of possible burst types;
   wherein the minimum distance is a measure of a number of bits in corresponding bit positions that differ between two codewords; and
   wherein each of a first and second critical burst type in the subset pair of critical burst types is selected from the group consisting of a type of voice burst, a type of data burst, and a type of control burst.

2. A method as claimed in claim 1, wherein:
   the FEC code comprises a data unit identification (DUID) code.

3. A method as claimed in claim 1, wherein the codewords are bits long, and wherein the increased minimum distance (dmin2) is n bits.

4. A method as claimed in claim 3 wherein:
   the subset pair of critical burst types is comprised of a 4 Voice Burst (4V) and a fast associated control channel (FACCH)/No scrambling burst.

5. A method as claimed in claim 3, wherein:
   the subset pair of critical burst types is comprised of a slow associated control channel (SACCH)/w scrambling burst and a SACCH/No scrambling burst.

6. The method of claim 1, wherein the subset pair of critical burst types is voice and control.

7. The method of claim 6, wherein the control burst type is an end of call control burst.

8. The method of claim 3, wherein n is 8.

9. A method of selectively utilizing one or more assigned codewords for a Forward Error Correcting (FEC) code by a radio operating within a wireless communication system to improve the detection and decoding of a subset pair of critical burst types out of a plurality of possible burst types at the radio, the method comprising:
   receiving a burst-by the radio;
   demodulating the burst by the radio; and
   decoding a codeword within the received burst using an assigned distance based on an expected burst type for the burst, wherein the assigned distance is an increased relative minimum distance when the expected burst type is one of a subset pair of critical burst types, and wherein the assigned distance is a decreased relative minimum distance when the expected burst type is not one of the subset pair of critical burst types;
   wherein the minimum distance is a measure of a number of bits in corresponding bit positions that differ between two codewords; and
   wherein each of a first and second critical burst type in the subset pair of critical burst types is selected from the group consisting of a type of voice burst, a type of data burst, and a type of control burst.

10. A method as claimed in claim 9, wherein:
    the FEC code comprises a data unit identification (DUID) code.

11. A method as claimed in claim 9, wherein the codewords are 'n' bits long, and wherein the increased minimum distance (dmin2) is n bits.

12. A method as claimed in claim 9 wherein:
    the subset pair of critical burst types is comprised of a 4 Voice Burst (4V) and a fast associated control channel (FACCH)/No scrambling burst.

13. A method as claimed in claim 10, wherein decoding the codeword when the expected burst is 4V voice comprises:
    decoding the DUID by the radio to determine whether it is more likely a 4V voice or a fast associated control channel (FACCH) without scrambling using the increased minimum distance.

14. A method as claimed in claim 13, wherein the decoding of the DUID by the radio comprises:
    comparing the received DUID with a DUID corresponding to the FACCH without scrambling;
    selecting the FACCH without scrambling as the decoded DUID when the number of bits in error is less than or equal to three (3); and
    selecting the 4V voice as the decoded DUID when the number of bits in error is greater than 3.

15. A method as claimed in claim 13, further comprising when the DUID is FACCH without Scrambling, operating the radio to:
    decode a payload of the received burst; and
    verify a cyclic redundancy check (CRC) within the received burst.

16. A method as claimed in claim 15, further comprising operating the radio to:
    end a call associated with the received burst when the CRC passes in the verifying step.

17. A method as claimed in claim 15, further comprising operating the radio to:
    determine whether a speech item is terminated when the CRC does not pass in the verifying step; and ending a call associated with the received burst when the speech item is terminated.

18. A method as claimed in claim 17, wherein determining whether the speech item is terminated comprises determining the received DUIDs do not match the expected DUIDs for a specified number of occurrences in a particular duration of time.

19. A method as claimed in claim 10, wherein decoding the DUID when the expected burst is not 4V voice comprises:
    decoding the DUID within the received burst using one bit error as a 2V voice codeword and a FACCH without scrambling codeword having the minimum distance between them.

20. A method as in claim 10, further comprising when the expected burst is a 4V voice, and when the DUID is FACCH without Scrambling, operating the radio to:
    decode a payload of the received burst; and
    verify a cyclic redundancy check (CRC) within the received burst.

21. A method as claimed in claim 20, further comprising operating the radio to:
    end a call associated with the received burst when the CRC passes in the verifying step.

22. A method as claimed in claim 20, further comprising operating the radio to:
    determine whether a speech item is terminated when the CRC does not pass in the verifying step; and
    ending a call associated with the received burst when the speech item is terminated.

23. A method as claimed in claim 22, wherein determining whether the speech item is terminated comprises determining the received DUIDs do not match the expected DUIDs for a specified number of occurrences in a particular duration of time.

24. The method of claim 9, wherein the subset pair of critical burst types is voice and control.

25. The method of claim 24, wherein the control burst type is an end of call control burst.

26. The method of claim 8, wherein n is 11.

* * * * *

UNITED STATES PATENT AND TRADEMARK OFFICE
CERTIFICATE OF CORRECTION

PATENT NO. : 8,281,216 B2
APPLICATION NO. : 12/415596
DATED : October 2, 2012
INVENTOR(S) : Desai et al.

It is certified that error appears in the above-identified patent and that said Letters Patent is hereby corrected as shown below:

In Column 9, Line 58, in Claim 3, delete "bits" and insert -- 'n' bits --, therefor.

In Column 11, Line 14, in Claim 20, delete "as in" and insert -- as claimed in --, therefor.

In Column 12, Line 18, in Claim 26, delete "claim 8, wherein n is 11." and insert -- claim 11, wherein n is 8. --, therefor.

Signed and Sealed this
Twelfth Day of February, 2013

Teresa Stanek Rea
*Acting Director of the United States Patent and Trademark Office*